United States Patent [19]

Haken et al.

[11] Patent Number: 5,389,809
[45] Date of Patent: * Feb. 14, 1995

[54] SILICIDED MOS TRANSISTOR

[75] Inventors: Roger A. Haken; Richard A. Chapman, both of Dallas, Tex.

[73] Assignee: Texas Instruments Incorporated, Dallas, Tex.

[*] Notice: The portion of the term of this patent subsequent to Jun. 4, 2008 has been disclaimed.

[21] Appl. No.: 841,900

[22] Filed: Feb. 25, 1992

Related U.S. Application Data

[63] Continuation of Ser. No. 651,096, Feb. 4, 1991, abandoned, which is a continuation of Ser. No. 489,843, Mar. 2, 1990, abandoned, which is a continuation of Ser. No. 149,784, Jan. 29, 1988, abandoned, which is a continuation-in-part of Ser. No. 718,818, Apr. 1, 1985, abandoned, which is a continuation of Ser. No. 344,589, Feb. 1, 1982, abandoned.

[51] Int. Cl.[6] .................. H01L 29/73; H01L 27/02
[52] U.S. Cl. .................. 257/344; 257/346; 257/369; 257/607; 257/770; 257/917; 257/900
[58] Field of Search .................. 357/23.1, 23.3, 23.4, 357/23.8, 23.9, 23.12, 59 I, 90, 91; 257/344, 346, 409, 607, 408, 770, 917

[56] References Cited

U.S. PATENT DOCUMENTS

| | | | |
|---|---|---|---|
| 4,291,321 | 9/1981 | Pfleiderer et al. | 357/91 |
| 4,369,072 | 1/1983 | Bakeman et al. | 357/91 |
| 4,384,301 | 5/1983 | Tasch et al. | 357/23.3 |
| 4,560,582 | 12/1985 | Ichikawa | 257/917 |
| 5,021,851 | 6/1991 | Haken et al. | 357/23.9 |
| 5,208,472 | 5/1993 | Su et al. | 257/344 |

OTHER PUBLICATIONS

Ohta et al "Quadruply Self-Aligned MOS (QSA MOS-)—A New Short-Channel High-Speed High-Density MOSFET for VLSI" IEEE Trans. Electron Devices vol. ED-27 (Aug. 1980) pp. 1352-1358.

Sunami et al "Characteristics of a Buried Channel, Graded Drain with Punch-Through Stopper (BGP) MOS Device" 1981 Symposium on VLSI Technology, Hawaii (Sep. 1981), Dig. Tech. Papers pp. 20-21.

Takeda et al "Submicron MOSFET Structure for Minimizing Channel Hot-Electron Injection" 1981 Symposium on VLSI Technology, Hawaii (Sep. 1981), Dig. Tech. Papers pp. 22-23.

Streetman, "Fabrication of P-N Junctions", *Solid-State Electronic Devices*, Seocnd Edition, 1980, pp. 128-136.

*Primary Examiner*—Gene M. Munson
*Attorney, Agent, or Firm*—Jacqueline J. Garner; Richard L. Donaldson; William E. Hiller

[57] ABSTRACT

A process for forming N-channel MOS sources and drains, by implanting both phosphorus and arsenic. The high diffusivity of phosphorus causes it to diffuse in advance of the bulk of the arsenic, so that, after annealing, the source/drain regions have graded regions of gradually decreasing conductivity adjacent to the end of the channels. Thus the electric potential gradient at the ends of the channels is reduced, and impact ionization and hot carrier effects are avoided. The effective radius of the source (or drain) junction is increased, providing increased breakdown voltage. The implantation of both phosphorus and arsenic with the resultant phosphorus peripheral band after annealing is used with self-aligned silicided source/drain regions to prevent silicide spiking through shallow arsenic regions to the P substrate and to prevent source/drain junction consumption during silicidation.

21 Claims, 2 Drawing Sheets

SILICIDED MOS TRANSISTOR

CROSS-REFERENCE TO RELATED APPLICATIONS

This application is a continuation of application Ser. No. 07/651,096, filed Feb. 4, 1991, now abandoned, which is a continuation of Ser. No. 489,843, filed Mar. 2, 1990, now abandoned, which is a continuation of Ser. No. 149,784, filed Jan. 29, 1988, now abandoned, which is a continuation-in-part of application Ser. No. 718,818, filed Apr. 1, 1985 now abandoned, which is a continuation of Ser. No. 344,589, filed Feb. 1, 1982, now abandoned. U.S. application Ser. No. 718,818 was abandoned upon the filing of Ser. No. 191,849, which was abandoned upon the filing of Ser. No. 453,097 which issued on Jun. 4, 1991 as U.S. Pat. No. 5,021,851.

BACKGROUND OF THE INVENTION

1. Field of the Invention

The present invention relates to electronic semiconductor devices, and, more particularly to source/drain structures of field effect transistors.

2. Description of the Related Art

A difficulty in the fabrication of small-geometry metal-oxide-silicon field effect transistors (MOSFET) is the following quandary: If the source/drains are doped to a level high enough to give reasonably low series resistance, the magnitude of the electric field in the channel adjacent to the drain during the on-state will be so high that hot carriers and impact ionization effects will become a nuisance.

As the MOSFET channel becomes shorter, the electric field along the channel becomes more important. That is, the potential distribution becomes two dimensional, and the effect of the electric field along the channel can no longer be ignored while considering the effects of the electric field normal to the channel. In particular, where the electric field along the channel is high, as it is likely to be in short-channel MOS devices impact ionization is likely to occur near the drain. The resulting substrate current greatly increases the likelihood of latch-up. In addition, hot carriers are also likely to be generated by the strong electric field magnitude near the drain, and some of these carriers may be injected into the oxide, leading to threshold shift.

A difficulty in fabricating MOS devices with reasonably shallow source/drain diffusions is that the sharp curvature of the junction will cause a locally increased electric field, and therefore a reduced breakdown voltage. This causes great difficulty when high-voltage devices with reasonably small geometry are desired. If an arsenic implanted drain junction is to have a reasonable curvature, a very long drive-in time is required, causing undesired thermal effects in the other parts of the device.

A further difficulty in the fabrication of small-geometry MOS integrated circuit devices is the parasitic source/drain resistance, and self-aligned silicides such as titanium disilicide are frequenctly formed on source/drains to lower the sheet resistivity. See for example, R. Haken, Application of the Self-Aligned Titanium Silicide Process to Very Large-Scale Integrated n-Metal-Oxide-Semiconductor and Complementary Metal-Oxide-Semiconductor Technologies, 3 J. Vac. Sci.-Tech. B 1657 (1985) and M. Alperin et al, Development of the Self-Alignqed Titanium Silicide Process for VLSI Applications, 32 IEEE Tr.Elec.Dev. 141 (1985). But a heavily phosphorus-doped N-type source/drain (to minimize the silicon/silicide contact resistance)leads to a deep source/drain region, large drain effect, and isolation encroachment. Contrarily, an arsenic doped source/drain region will not be deep enough to avoid consumption of the shallow arsenic-doped silicon during silicidation leading to high junction leakage or spiking by the silicide through to the substrate if (as in CMOS structures) only low temperature drive-ins of implants can be used because of the high diffusivity of boron implants in other parts of the integrated circuit.

Thus the known small-geometry MOS devices have problems including hot electrons, high source/drain contact resistance to an overlying silicide layer, and shallow junction consumption/silicide spiking during silicidation leading to junction leakage.

SUMMARY OF THE INVENTION

Both arsenic and phosphorus are implanted to form the drain of an N-channel transistor. Preferably the phosphorus is implanted in a dose no larger than the arsenic.

Since the two implants are identically masked, the greater diffusivity of the phosphorus means that it will diffuse laterally in advance of the arsenic during annealling of the implant. Thus, in some preferred embodiments the arsenic provides low contact resistance, while the phosphorus provides reasonably gentle junction curvature. Moreover, a region of graduated doping will exist at the boundary between the drain and channel, so that the potential distribution in this area is smoothed out, and the peak electric field magnitude is reduced. Thus, the effects caused by highly-accelerated carriers are reduced. Not only is impact ionization and hot carrier generation reduced, but other short-channel effects, punchthrough, variable threshold voltage, and degradation of subthreshold behavior, are reduced.

In other preferred embodiments the phosphorus insures a junction deep enough to prevent junction consumption during silicidation or silicide spiking through to the substrate, and the region of graduated doping between the channel region and the drain (lightly doped drain) is formed by an additional phosphorus implant prior to a sidewall oxide formation.

BRIEF DESCRIPTION OF THE DRAWINGS

The drawings are schematic for clarity.

DESCRIPTION OF THE PREFERRED EMBODIMENTS

Figure 1:
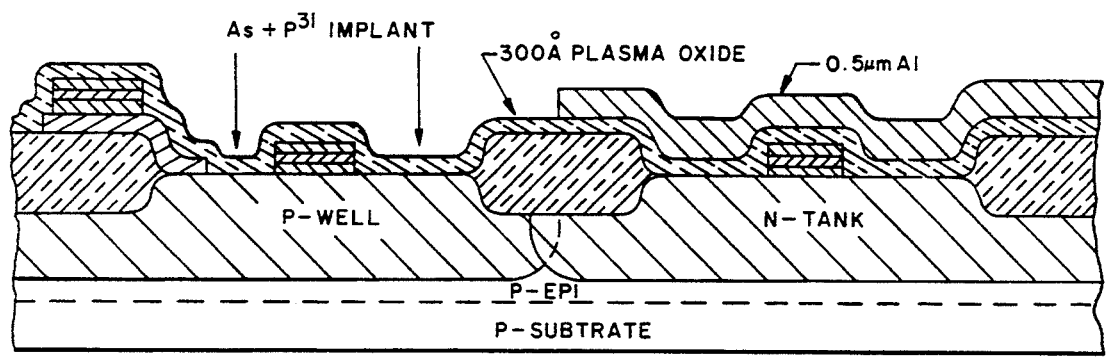
FIG. 1 shows ion implantation of the source/drain regions in an N-channel devices, during CMOS processing.
Figure 2:
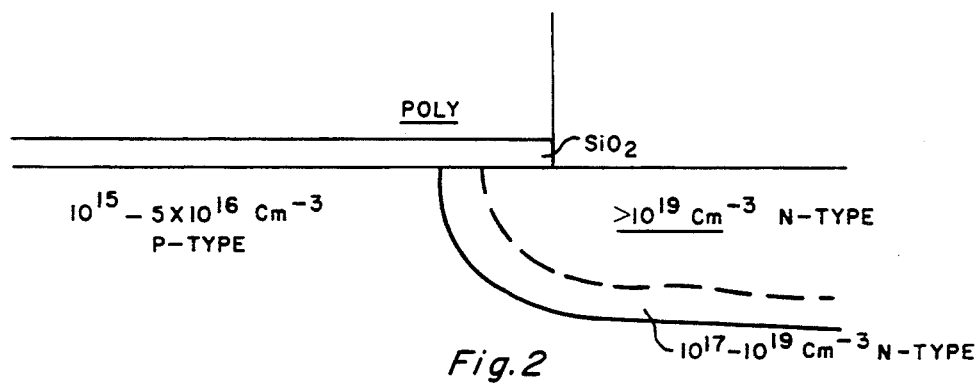
FIG. 2 shows the dopant distribution in a first preferred embodiment NMOS drain region, after annealling of a double implant.

The present invention applies to the formation of source/drain regions in MIS devices. It is of particular importance in optimizing the characteristics of the drain region. The presently preferred embodiment is in the fabrication of NMOS devices within a CMOS structure. FIG. 1 shows implantation of N-type source/drains within CMOS processing for a first preferred embodiment, both phosphorus and arsenic are implanted at this step. Moreover, the implant energies are preferably selected so that the depth profiles of concentration as implanted are approximately the same for the two impurities. Thus, for example implant energies of 120 keV for arsenic and 50 keV for phosphorus 31 would give similar as-implanted profiles for the two impurities. After annealing, the implanted phosphorus will have diffused slightly in advance of the implanted arsenic, so that, behind the drain/channel junction, a gradation in conductivity will exist, as shown in FIG. 2.

Figure 3:
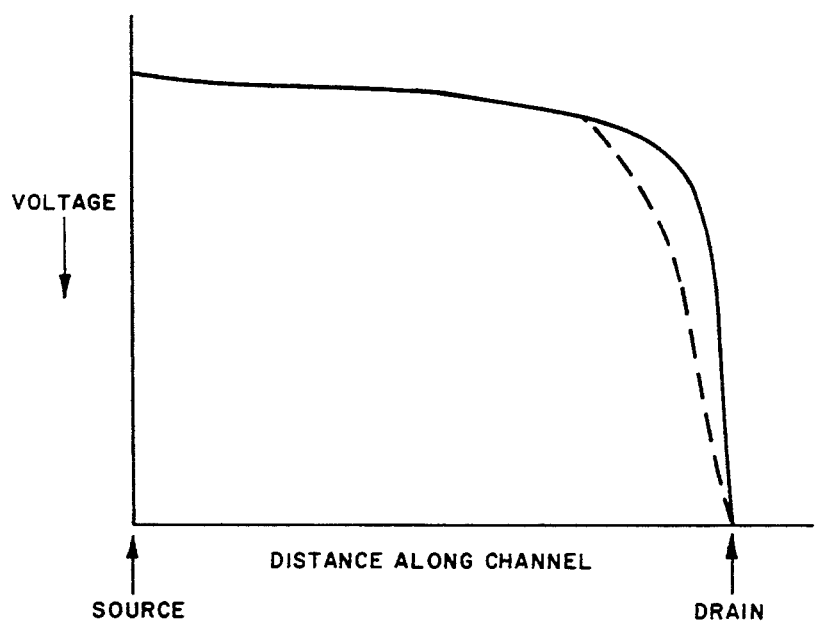
FIG. 3 shows approximately the electric potential distribution along the channel of a first preferred embodiment NMOS device with double-implanted source/drains.

The effect of this is shown in FIG. 3. The dashed line at FIG. 3 schematically shows sample on-state electric potential profiles along the channel, where source/drain regions have been formed according to the first preferred embodiment. The solid line of FIG. 3 schematically shows the potential distribution which would exist under the same conditions of gate source, and drain voltage, where the device geometry is the same except that the sources and drains are of uniform conductivity. As may easily be seen from this figurer the effect of the first preferred embodiment is to greatly reduce the gradient of the electric potential near the drain, and therefore to greatly reduce the peak electric field.

It will be obvious to those skilled in the art that the first preferred embodiment may be applied in a wide variety of processes and contexts. In particular, it is applicable to formation of N-channel devices in either CMOS or NMOS technology.

Moreover, the first preferred embodiment can also be applied to other combinations of dopants. The key requirement is that two dopants of the same type having different diffusivities, be used; for example, boron and gallium can be used to form P-channel devices, as can boron and indium.

A sample application of the first preferred embodiment implants $1 \times 10^{16}/cm^2$ of arsenic at 120 keV, and $2 \times 10^{15}/cm^2$ of phosphorus at 50 keV, into the regions exposed by the N-type source/drain mask, during CMOS processing. A single annealing step follows. Further background on integrated circuit processing is found in, e.g. A. Glaser and G. Subak-Sharpe Integrated Circuit Engineering which is hereby incorporated by reference.

The anneal is performed with parameters well known in the art. For example: 50 nm of plasma-assisted CVD oxide is first deposited. The oxide is densified at 700 degrees C., with 10 minutes in $O_2$, 30 minutes in steamy and 10 minutes in argon. The temperature is then raised to 1000 degrees C. in Ar and held at 1000 degrees C. for 20 minutes. The temperature is then lowered to 800 degrees C., and held there for 30 minutes, still in argon. Next 650 nm of phospho-silicate glass (PSG) is deposited, and the PSG is reflowed at 975 degrees C., with 14 minutes in $O_2+N_2$, 2 minutes in $O_2+N_2$ with $POCl_3$ doping, and 3 minutes in $O_2+N_2$ again. These annealing times represent only one choice within a broad range of parameters, and longer times at lower temperatures, or higher temperatures at lower times, may also be used. In addition, the annealing time at a given temperature may also be increased (or decreased), in which case the diffusion length of the phosphorus implant beyond the arsenic implant will also increase (or decrease). The oxide and PSG deposition steps are detailed here because the high-temperature PSG reflow further contributes to annealing the source/drain implants. However, the implant annealing (drive-in) is affected only by time and temperature and not be the surface depositions. This annealing process results in about 0.3 micron band at the edge of the source/drain region where the phosphorus has diffused beyond the arsenic. Thus, a source/drain formed by the first preferred embodiment double-implant process has (1) a central core having a high concentration of both arsenic and phosphorus, surrounded by (2) a peripheral band, within the junction at the sides of the source/drain region where the total dopant concentration is much lower and is largely composed of phosphorus.

The maximum thickness of the peripheral band is determined merely by the desired size of the source/drain junction boundary. (Excessive drive-in time will shorten channel length may infringe the lateral spacings which avert latch-up or may conduce to punch-through in the P-well technology.) There is no specific minimum thickness for the peripheral band but the advantages of the first preferred embodiment are less well obtained with shorter drive-in time. However the thickness of the peripheral band is preferably at least one-tenth of the source/drain junction depth.

Figure 4:
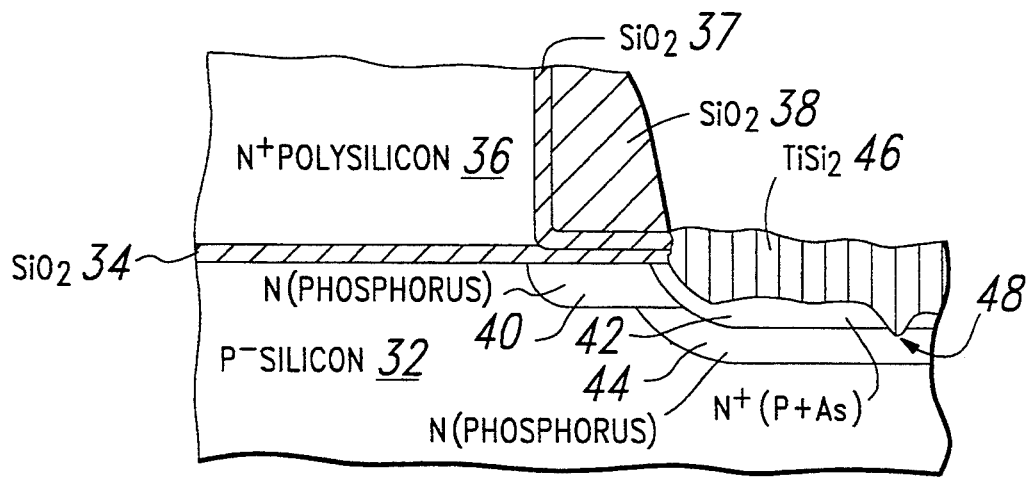
FIG. 4 shows a second preferred embodiment double-implanted, silicided N-channel device with a lightly doped drain.

A second preferred embodiment N-channel MOS transistor is shown about the drain/channel junction in cross sectional elevation view in FIG. 4 and includes P-type silicon substrate 32 (boron doping level of about $1 \times 10^{16}/cm^3$) with gate oxide 34, polysilicon gate 36 cap oxide 37 sidewall oxide 38 lightly doped drain region 40 (phosphorus doping level of about $1 \times 10^{17}/cm^3$), heavily doped drain region 42 (arsenic doping level of about $1 \times 10^{19}/cm^3$ plus some phosphorus), drain peripheral band 44 (phosphorus doping level of about $1 \times 10^{17}/cm^3$), and titanium disilicide 46 cladding on the drain. Also, a silicide spike 48 is shown penetrating the arsenic doped portion of the drain 42 down to the phosphorus peripheral band 44. Regions 32 40, 42, and 44 form a single crystal of silicon. For a 1 μm long gate, typical dimensions of the regions would be as follows: lightly doped drain region 40 is about 0.15 μm thick, heavily doped drain region 42 averages about 500 Å thick, drain peripheral band 44 is about 0.15 μm thick, and titanium disilicide 46 is about 0.15 μm thick. Note that the silicide/silicon interface has a peak-to-valley roughness of about 300 Å.

Figure 5A:
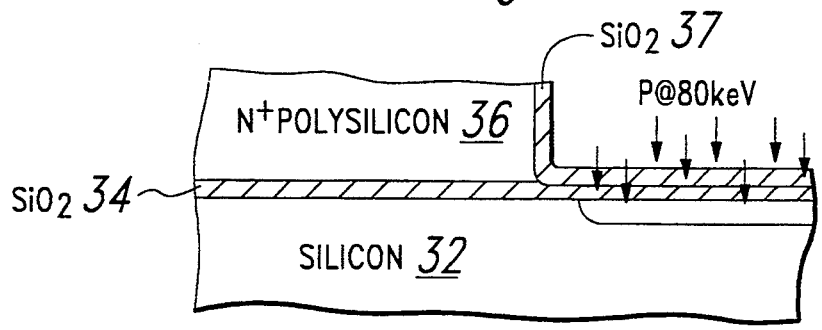
FIGS. 5A–C show the steps in the fabrication of the second preferred embodiment.
Figure 5B:
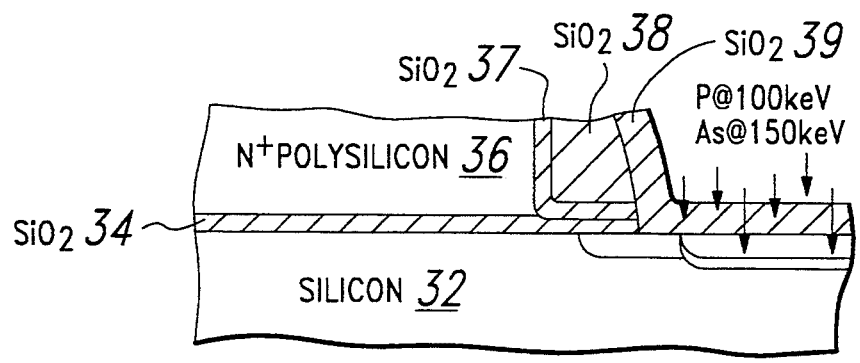
Figure 5C:
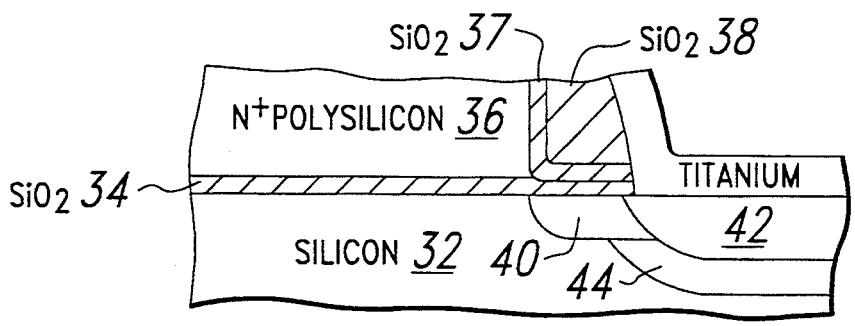

Further characteristics of the second preferred embodiment may be seen in connection with a description of a preferred embodiment method of fabrication which includes the following steps illustrated in FIGS. 5A–C:

(a) Grow gate oxide 34 (to a thickness of 200 Å) and deposit first level polysilicon (to a thickness of 3,500 Å) on P-type <100> oriented silicon substrate 32 (or, for CMOS, in the P well of a silicon substrate). Photolithographically pattern and etch the first level polysilicon to from gate 36; the polysilicon etch is selective against oxide but the use of an overetch removes up to about 50 Å of the exposed gate oxide 34 that is not protected by the gate 36. (Alternatively, a nonselective etch could be used and all of the exposed gate oxide removed.) Deposit 300 Å of conformal TEOS cap oxide 37, and implant a dose of $2 \times 10^{13}/cm^2$ phosphorus at 80 keV through cap oxide 37 and gate oxide 34; see FIG. 5A. This phosphorus implant will form the lightly doped drain region 40.

(b) Deposit 3,500 Å of conformal TEOS oxide and anisotropically etch it to form sidewall oxide 38. This etch removes all of the exposed cap oxide 37 and gate oxide 34 not protected by either gate 36 or sidewall oxide 38. Deposit 300 Å of conformal TEOS second cap oxide 39 and implant a dose of $3.5 \times 10^{15}/cm^2$ arsenic at 150 keV plus a dose of $4 \times 10^{14}/cm^2$ phosphorus at 100 keV through cap oxide 37; see FIG. 5B. Note that the total lateral spacing of this implant from gate 36 is about 4,000 Å:300 Å of oxide 37, 3,400 Å of sidewall oxide 38, and 300 Å of oxide 39. Note that in FIG. 5B the thickness of sidewall oxide 38 has been drawn smaller than actual relative to oxides 34 and 37 for clarity. (For CMOS also implant boron for P-channel source/drains with the N-channel regions masked.)

(c) Anneal the implants at 900° C. for 30 minutes; tiffs diffuses the arsenic and phosphorus to form lightly doped drain region 40, heavily doped drain region 42, and drain peripheral band 44. Heavily doped (primarily arsenic with some phosphorus) region 42 is 0.1–0.15 μm deep and peripheral band 44 (phosphorus) is about 0.15 μm deep. Etch second cap oxide 39 and deposit 1000 Å of titanium; see FIG. 5C.

(d) React the titanium with contiguous silicon at 675° C. in a nitrogen atmosphere or with a cap (such as silicon oxide or nitride) on the titanium. The titanium consumes a majority of the arsenic doped drain region 42 to form the silicide 46 and reaction spikes 48 may occur because some regions may form silicide more rapidly than others due to differences such as native oxide thickness on the silicon that retards the silicide reaction. Tiffs also accounts for the observed surface roughness of the silicide film that has a typical peak to valley roughness of 300 Å. This completes the device as shown in FIG. 4.

The second preferred embodiment N-channel MOS transistor thus has a drain structure that provides a shallow heavily-doped drain junction for low contact resistance to the silicide plus a lightly-doped peripheral band that prevents both consumption of the doped silicon during silicidation and silicide spiking through the junction.

MODIFICATIONS AND ADVANTAGES

Various modifications of the preferred embodiment devices and methods may be made while retaining the features of a heavily doped surface region at the silicide interface and a more lightly doped peripheral band. This yields a high dopant concentration at the silicide/junction interface to minimize contact resistance, and a junction which is deep enough to eliminate both junction leakage due to silicon consumption during silicidation and silicide spiking of the junction due to differing silicide formation rates, but which is and shallow enough to avoid heavy doping which leads to isolation encroachment/channel encroachment and hot electron problems in n-channel devices.

Variations in the second preferred embodiment include eliminating the separately implanted lightly doped drain 40 and relying on the peripheral band for the graded drain doping.

What is claimed is:

1. A field effect transistor drain structure comprising:
   a semiconductor substrate doped a first conductivity type and having a structure formed thereon;
   a first region in said substrate heavily doped a second conductivity type with two dopants having different diffusion characteristics, said heavily doped first region including a common area defined by the implantation of said two dopants and an area of simultaneous diffusion of said two dopants extending away from said implantation area and under said structure said diffusion area having a curved shape defined by said simultaneous diffusion;
   a second region in said substrate lightly doped as a second conductivity type by the greater diffusion of a single one of said two dopants, said dopant in said second region consisting essentially of said single dopant diffused from said first region during said simultaneous diffusion, said second region defining a peripheral band between said semiconductor substrate and said area of simultaneous diffusion in said first region and having a curved shape defined by said greater diffusion of said only one dopant; and
   a third doped region formed in said substrate adjacent said first region and beneath said structure.

2. The transistor of claim 1 wherein said third doped region has a doping profile characterized by doping with ion implantation.

3. The transistor of claim 2 wherein said third doped region has a doping profile characterized by doping by means of ion implantation followed by a diffusion.

4. The structure of claim 1 and further comprising a refractory metal silicide layer disposed outwardly of said first region.

5. The structure of claim 4, wherein:
   (a) said refractory metal is titanium.

6. The structure of claim 1 wherein said two dopants comprise arsenic and phosphorus and wherein said single dopant comprises phosphorus.

7. The structure of claim 1 wherein one of said two dopants comprises boron and the other of said two dopants is chosen from the group consisting of gallium and indium.

8. A field effect transistor drain structure comprising:
   a semiconductor substrate doped a first conductivity type and having a structure formed thereon;
   a first region in said substrate heavily doped a second conductivity type with two dopants having different diffusion characteristics, said heavily doped first region including a common area defined by the implantation of said two dopants and an area of simultaneous diffusion of said two dopants extending away from said implantation area and under said structure said diffusion area having a curved shape defined by said simultaneous diffusion;
   a second region in said substrate lightly doped as a second conductivity type by the greater diffusion of a single one of said two dopants, said dopant in said second region consisting essentially of said single dopant diffused from said first region during said simultaneous diffusion, said second region defining a peripheral band between said semiconductor substrate and said area of simultaneous diffusion in said first region and having a curved shape defined by said greater diffusion of said only one dopant; and
   a refractory metal silicide layer disposed outwardly of said first region.

9. A MIS transistor comprising:

a semiconductor layer of a first conductivity type;

first and second source/drain regions of an opposite conductivity type each comprising a junction within said layer, said first and second source/drain regions defining a channel region therebetween;

a lightly doped region formed in said channel region adjacent one of said source/drain regions;

a gate dielectric on said channel; and a gate on said gate dielectric;

wherein said first source/drain region comprises a core region and a peripheral band, said peripheral band being interposed between said core region and said channel region, said core region including a common portion implanted with two dopant species of the same conductivity type and another portion diffused outwardly from said common portion and having a curved shape defined by the simultaneous diffusion of said two dopants, and said peripheral band including a significant concentration of only one of said two dopant species, said only one dopant consisting essentially of dopant diffused from said core region and said peripheral band having a curved shape defined by the diffusion of said only one dopant during said simultaneous diffusion and which diffusivity is greater than that of said other dopant.

10. The transistor of claim 9 wherein said semiconductor layer comprises silicon and wherein said core region of said first source/drain region contains arsenic and phosphorus and said peripheral band contains phosphorus.

11. The transistor of claim 10 wherein said lightly doped region contains phosphorus.

12. The structure of claim 9 wherein one said two dopants comprises boron and the other of said two dopants is chosen from the group consisting of gallium and 13. The structure of claim 9 and further comprising a refractory metal silicide layer disposed outwardly of said first and second source/drain regions.

14. The structure of claim 13 wherein:

(a) said refractory metal is titanium.

15. An insulated gate field effect transistor, comprising:

a substrate containing source, drain, and channel regions at a surface, said channel region of a first conductivity type and said source and drain regions of opposite conductivity type;

a lightly doped region formed in said channel region adjacent said drain regions;

a gate insulator on said surface and covering at least said channel;

a gate on said gate insulator and with sidewalls substantially perpendicular to said surface at said insulator;

said drain region comprising a core region and a surrounding peripheral region, said core region heavily doped by a combination of two implanted dopants of different diffusivities and comprising an area of implantation aligned with an edge of said gate and an area of simultaneous diffusion of both of said implanted dopants extending away from said implantation area and under said gate and with a curved shape defined by said simultaneous diffusion, said peripheral region comprising a lightly doped diffusion band between said substrate and said diffusion area of said core region, the dopant in said lightly doped diffusion band consisting essentially of the greater diffusion of a single one of said two dopants implanted in said core region and said peripheral region having a curved shape defined by the greater diffusion of said single one dopant.

16. The transistor of claim 15 and further comprising a refractory metal silicide layer disposed outwardly of said source and drain regions.

17. The transistor of claim 16 wherein said two dopants comprise arsenic and phosphorus.

18. A field effect transistor drain comprising:

a semiconductor substrate doped a first conductivity type and having a structure formed thereon;

a first region in said substrate heavily doped a second conductivity type by implantation of two dopants to approximately the same depth and having different diffusion characteristics said heavily doped first region including an implementation area defined by said implantation of said two dopants and with an edge aligned with an edge of said structure and an area of diffusion of said two dopants extending away from said implantation area and under said structures, said area of diffusion having a curvature defined by said diffusion of said two dopants;

a second region in said substrate lightly doped as a second conductivity type, said dopant in said second region consisting essentially of the greater diffusion of a single one of said two dopants from said first region, said second region defining a peripheral band between said semiconductor substrate and said diffusion area of said first region and having a curved shape defined by the diffusion of said single dopant; and a third region formed in said substrate adjacent said first region and beneath said structure, said third region doped with impurities of said second conductivity type.

19. The structure of claim 18 and further comprising a refractory metal silicide layer disposed outwardly of said first region.

20. The structure of claim 18 wherein said two dopants comprise arsenic and phosphorus.

21. The structure of claim 18 wherein one said two dopants comprises boron.

* * * * *